United States Patent [19]
Jacobs

[11] Patent Number: 5,060,113
[45] Date of Patent: Oct. 22, 1991

[54] CONNECTOR ASSEMBLY

[75] Inventor: Brian Jacobs, Palo Alto, Calif.

[73] Assignee: Raychem Corporation, Menlo Park, Calif.

[21] Appl. No.: 561,228

[22] Filed: Jul. 31, 1990

Related U.S. Application Data

[63] Continuation of Ser. No. 172,739, Mar. 23, 1988, abandoned, which is a continuation-in-part of Ser. No. 36,060, Apr. 9, 1987, abandoned.

[51] Int. Cl.⁵ .............................................. H05K 7/20
[52] U.S. Cl. .................................... 361/386; 361/399; 361/413; 439/65; 439/75
[58] Field of Search ................................. 361/385–389, 361/392–395, 399, 410, 413, 415, 424; 439/65, 74, 75

[56] References Cited

U.S. PATENT DOCUMENTS

| | | | |
|---|---|---|---|
| 3,234,433 | 2/1966 | Braunazel | 439/75 |
| 3,372,310 | 3/1968 | Kantor | 361/392 |
| 3,616,533 | 11/1971 | Heap et al. | 361/387 |
| 4,451,107 | 5/1984 | Dola et al. | 439/65 |
| 4,514,784 | 4/1985 | Williams et al. | 361/386 |
| 4,542,437 | 9/1985 | Ellis et al. | 361/424 |
| 4,546,412 | 10/1985 | Nakazawa et al. | 361/395 |
| 4,686,607 | 8/1987 | Johnson | 361/413 |
| 4,723,196 | 2/1988 | Hofmeister | 361/395 |

FOREIGN PATENT DOCUMENTS

| | | | |
|---|---|---|---|
| 189240 | 1/1986 | European Pat. Off. | |
| 8800603A | 1/1988 | European Pat. Off. | |
| 1156172 | 10/1963 | Fed. Rep. of Germany | 361/352 |
| 1765837 | 11/1971 | Fed. Rep. of Germany | |
| 2800080 | 7/1978 | Fed. Rep. of Germany | 361/387 |
| 2842892 | 4/1979 | Fed. Rep. of Germany | 439/65 |
| 8630076 | 1/1987 | Fed. Rep. of Germany | |
| 3728456 | 3/1989 | Fed. Rep. of Germany | |
| 2005929A | 4/1979 | United Kingdom | |

OTHER PUBLICATIONS

Patent Abstract of Japan, vol. 7, No. 204.
Patent Abstract of Japan JP-A-58 101,447.

*Primary Examiner*—Gregory D. Thompson
*Attorney, Agent, or Firm*—Edith A. Rice; Herbert G. Burkard

[57] ABSTRACT

This invention provides a connector assembly for forming electrical connections to at least two circuit boards disposed in a parallel surface-to-surface relationship. The assembly comprises at least two modules, each of which comprises connector elements. A first set of connector elements provides connections between the circuit board and another electrical device, and a second set of connector elements provides connections between the circuit boards. A heat sink may be provided between the circuit boards. Electronic components on the circuit boards may be sealed by means of a gel, which can also serve to transmit heat from the components.

7 Claims, 3 Drawing Sheets

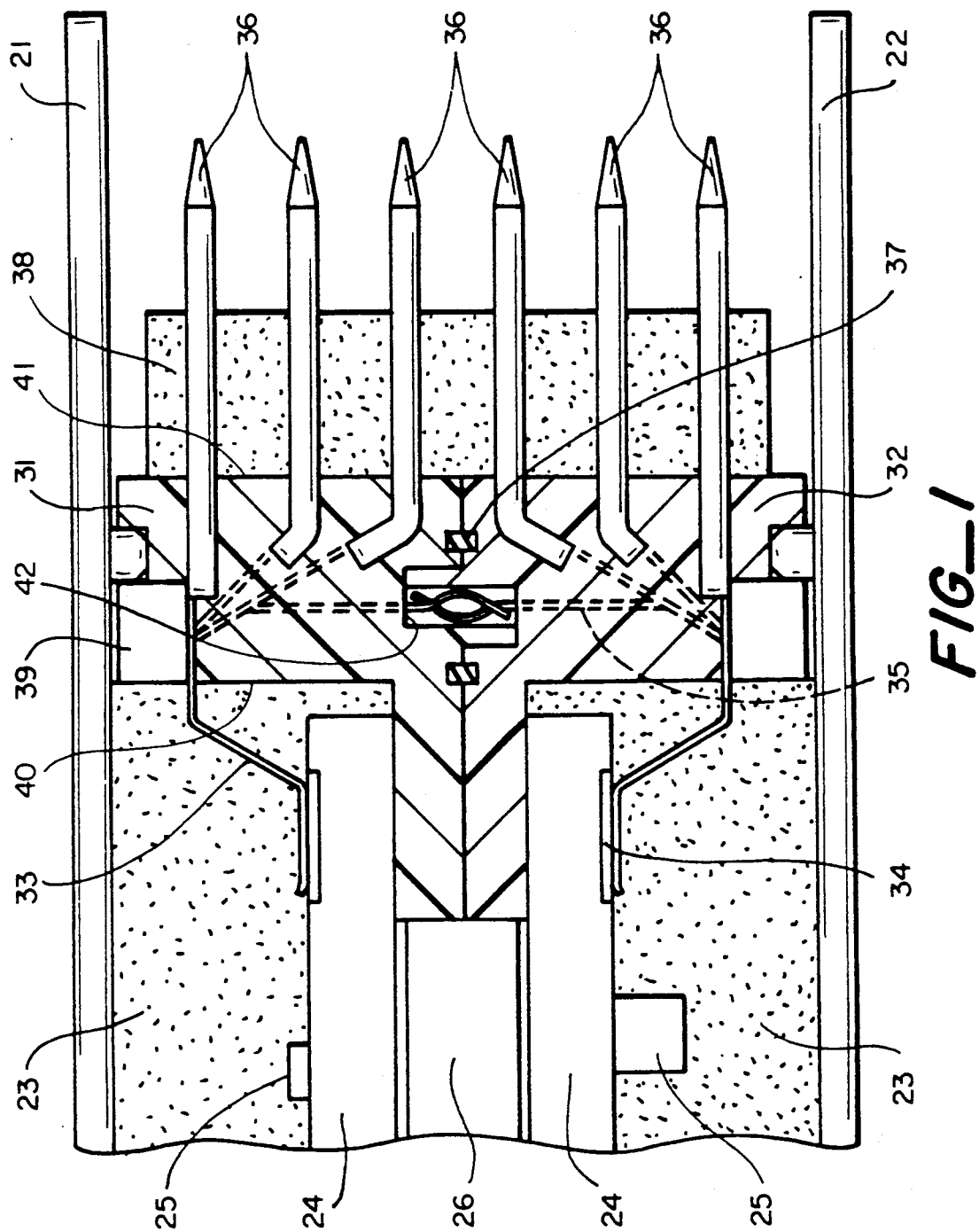
FIG_1

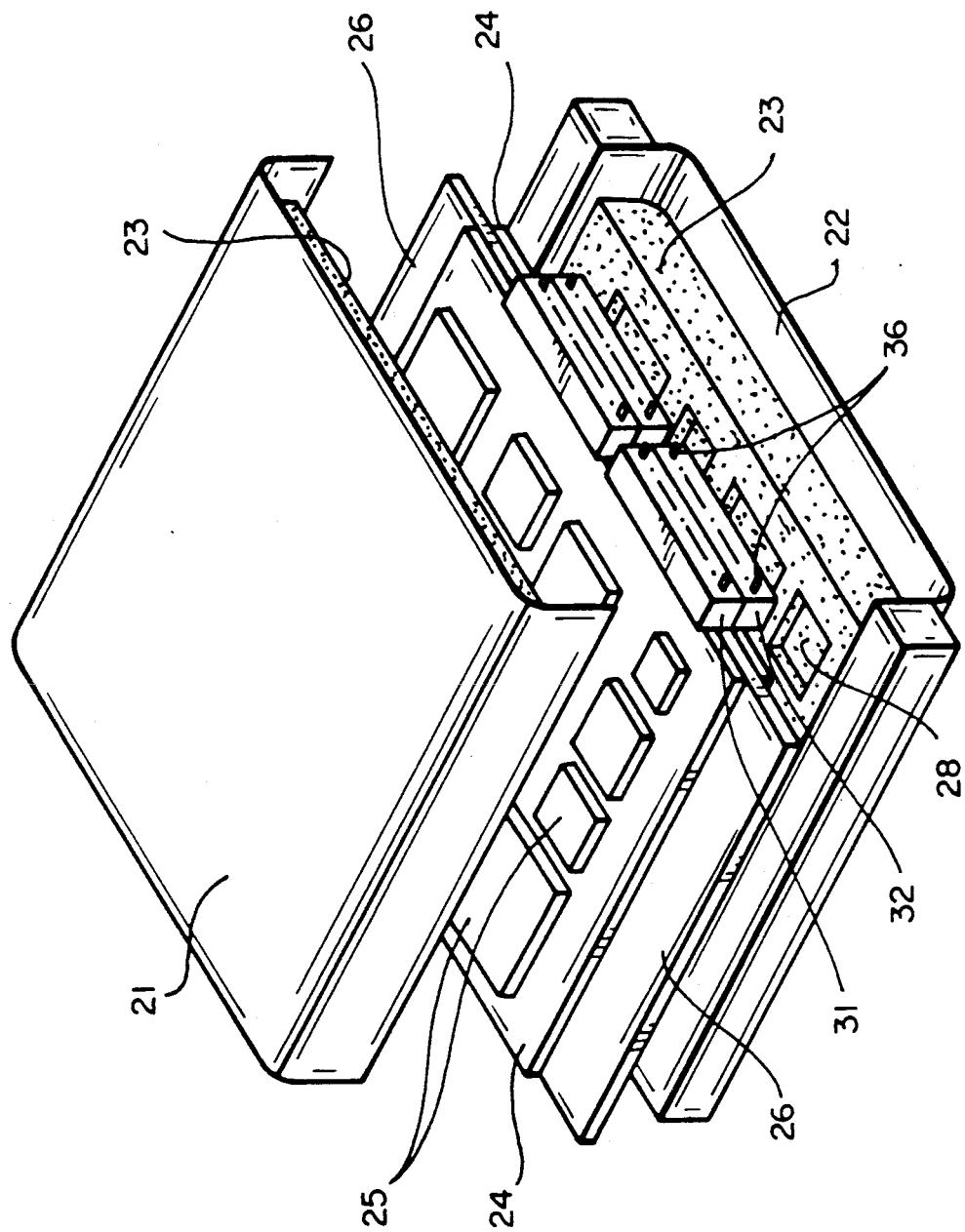
FIG_2

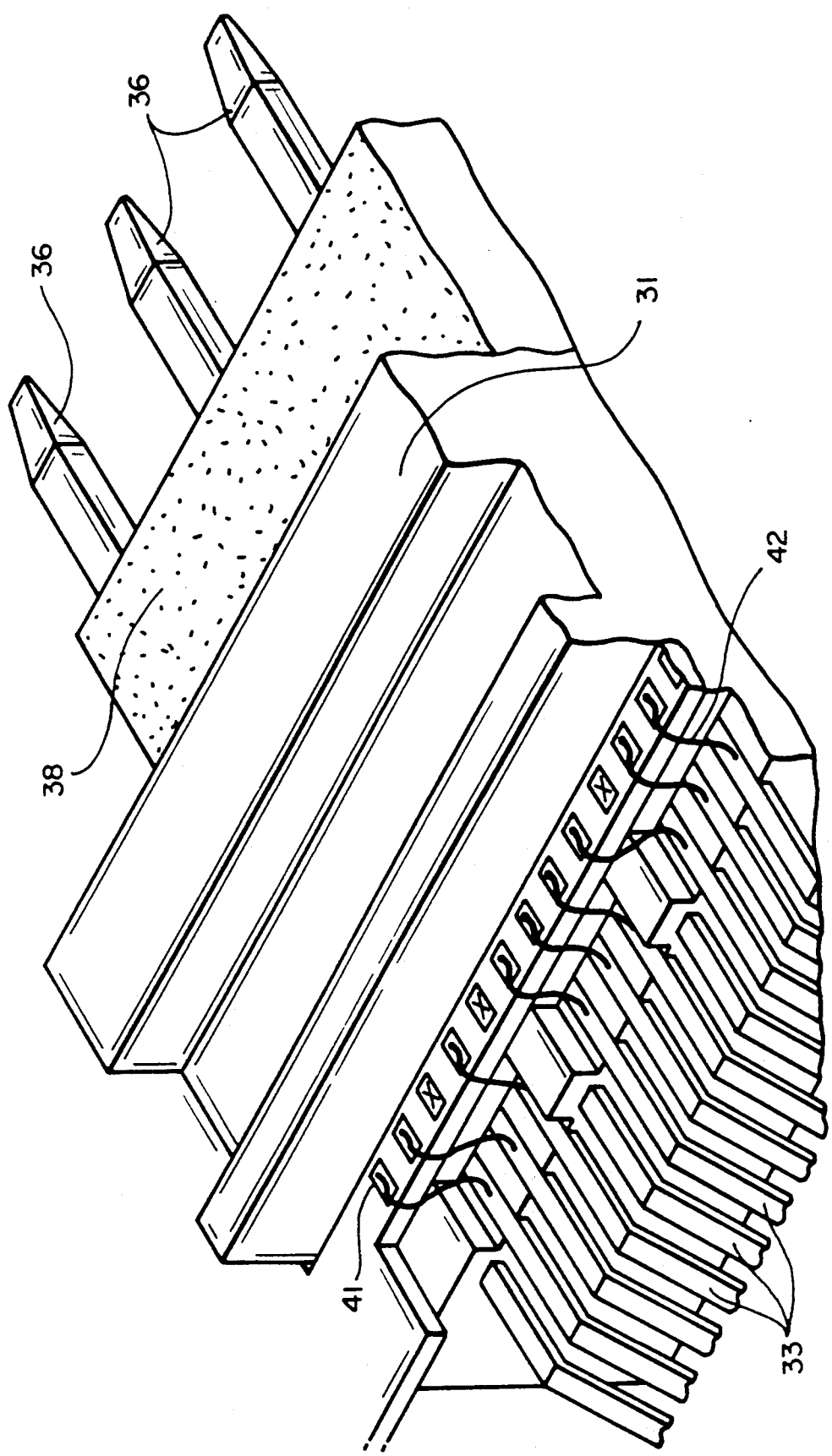
FIG_3

CONNECTOR ASSEMBLY

CROSS-REFERENCE TO RELATED APPLICATION

This application is a continuation of application Ser. No. 07/172,739 filed Mar. 23, 1988 which is a continuation-in-part of application Ser. No. 07/036,060 filed Apr. 9, 1987, both abandoned.

BACKGROUND OF THE INVENTION

This invention relates to a connector assembly for forming electrical connections to at least two circuit boards disposed in a substantially parallel surface-to-surface relationship, and to a circuit board assembly which comprises the connector assembly.

In conventional modular electronic packaging, it is known to arrange electronic components on daughter circuit boards, and to attach the daughter boards to a mother board through which electrical connections between daughter boards can be made. It is desirable to maintain as small as possible the space that is occupied by the circuit boards and components thereon; however close packing of the circuit boards can cause undesirable increase in operating temperature of the components because of heat emitted by the components. It is therefore customary to provide one or more heat sinks to dissipate heat from the circuit boards in an electronic package. In a preferred arrangement, circuit boards are provided in surface-to-surface contact one on each side of a planar heat sink. In this arrangement, connections between the circuit boards on opposite sides of the heat sink may be made through the mother board, or by means of flexible conductors that are attached, for example by means of solder, to contacts on the circuit boards.

SUMMARY OF THE INVENTION

The present invention provides a connector assembly for forming electrical connections to at least two circuit boards disposed in a substantially parallel surface-to-surface relationship, comprising a plurality of mateable connector modules, each of which comprises a plurality of respective contacts on one of the circuit boards, a first set of the contact elements having contact portions for connection to an electrical device so as to form connections between the device and the said contacts on the circuit board, and a second set of the contact elements having contact portions for connection to respective contact portions of the second set of contact elements of the other module so as to form connections between respective contacts on the two circuit boards when the modules are mated.

The connector assembly of the invention has the advantage that the electrical connections between circuit boards disposed in a substantially parallel surface-to-surface relationship, for example on opposite sides of a planar heat sink, can easily be made and unmade, without the need to reflow solder as is necessary when the connections are made by means of flexible conductors. This facilitates maintenance and repair of circuit board assemblies. Furthermore, the length of the path along which electrical signals must pass between the circuit boards is reduced by use of the connector assembly of the invention in place of flexible conductors. This allows the speed of operation of the device, of which the circuit boards form a part, to be increased. Yet further, the connector assembly of the invention can be arranged to occupy less space than flexible conductors that otherwise might be used to interconnect circuit boards.

The connector assembly will generally comprise as many connector modules as there are daughter circuit boards to be connected by it to a mother board.

Each module comprises contact elements which have contact portions for connection to electrical contacts. The configuration of the elements will depend on the nature of the connection between the electrical contacts and the contact portions. For example, the contact portions may be arranged for solder connection, wire wrap connection, spigot and socket connection or resilient spring connection. The contact portions for connection to contacts on the circuit boards are preferably suitable for solder connection; for example they may have a generally flattened surface for receiving solder.

The first set of contact elements are for connection to an electrical device. The device may comprise a mating half of a connector which may be a termination on an electric cable or more preferably may be mounted on a mother board. When the device comprises a half-connector for cooperating with the connector assembly of the invention, the contact portions are preferably arranged for spigot and socket connection; for example, the contact elements may provide pins for cooperating with corresponding recesses on the device, or the reverse arrangement may be used. Spigot and socket connections have the advantage of being easy to make and to unmake, for example for the purposes of repair or replacement of the circuit board assembly.

The second set of contact elements provide electrical connection between contacts on the two circuit boards when the modules are mated. Preferably the relevant contact portions of the second set of contact elements fit together with an interference fit, for example they may comprise a spigot and socket combination. More preferably, they are arranged to be resiliently biased towards one another, for example they may be formed from a resiliently deformable material in such a way that when the modules are mated with one another, the contact portions of the second set of contact elements are forced towards one another. This may be arranged by providing the contact portions with a surface that is oblique to the axis along which the modules are moved towards one another.

Preferably, the contact portions for connection to the circuit board contacts are provided on a first face of each module; the contact portions for connection to the electrical device are provided on a second face of each module that is opposite and substantially parallel to the first face; and the contact portions for connection to the contact elements on the other module are provided on a third face of each module that is substantially perpendicular to the first and second faces. When such modules are mated with one another so that the respective third faces are in contact, it is possible for the first faces of the two modules to be adjacent to one another for connection to two or more circuit boards disposed in a substantially parallel surface-to-surface relationship, and for the second faces of the two modules to be adjacent to one another, preferably contiguous, for connection to an electrical device.

The configuration of the first and second sets of contact elements may be designed individually into each module according to the requirements of each application. In this case, one piece contact elements may be used. In another arrangement, some or all of the contact elements may comprise two or more pieces between which connection is made to create a configuration of contact elements that is suited to the application in which the module is to be used.

The connector assembly may be designed for interconnection of two or more circuit boards; when intended to interconnect more than two circuit boards, one or more of the modules may be provided with two second sets of contact elements, each second set providing contact portions on opposite faces of the module for connection to an adjacent module.

Preferably the connector assembly is provided with means for preventing ingress of contaminants between the mated surfaces of the modules, especially to prevent ingress of moisture or of any other material that can disrupt the electrical signals that pass between the modules. More preferably, the connector is provided with a seal to prevent ingress of moisture or of other contaminants, the seal comprising, for example, an elastomeric gasket, or one or more pieces of a sealing material such as a mastic or a gel. In a particularly preferred arrangement, each contact portion intended for connection to contact portions on the other module is individually sealed by means of a gel, or other sealing material. For example, when the contact portions are arranged to be resiliently deformable, they may be surrounded by sealing material which is able to accommodate movement thereof. It is especially preferred that the contact portions be mounted in respective recesses in the module, each of the recesses being filled at least partially with sealing material. Gels having a cone penetration value of from about 50 to about 350 (mm$^{-1}$) and an ultimate elongation of at least about 100% are preferred sealing materials, suitable materials and test methods being described in U.S. Pat. No. 4,600,261, U.S. Pat. No. 4,634,207, U.S. Pat. No. 4,610,738, U.S. Pat. No. 4,595,633 and International patent application No. GB/8700506, the disclosures of which are incorporated herein by reference.

The invention also provides a circuit board assembly which comprises two circuit boards that are electrically connected to one another by means of the connector assembly of the invention. Generally, the circuit boards will be disposed in a substantially parallel surface-to-surface relationship. Preferably, the circuit board assembly includes a heat sink element between the circuit boards with which the boards are in thermal contact.

Preferably the circuit board assembly includes a case for enclosing the circuit boards. The case can provide a heat sink for the circuit boards, in which case, the or each circuit board should preferably be in thermal contact with a wall of the case. The circuit board may be maintained in thermal contact with the case by means of a resiliently deformable material. The material may be in the form of a mechanical element such as a spring. More preferably however, the material is a gel. The use of a gel has many advantages. For example, it provides environmental sealing for components on the circuit board with which it is in contact, and can provide additional heat dissipation. It is particularly preferred that the gel is provided on a wall of the case that is removable so that closing the case places the gel in thermal contact with the board and urges the board against the heat sink wall of the case. The use of a gel in this way has the advantage that it is readily removable for replacement or repair of the circuit board or of components thereon, but that it is able to also provide environmental sealing when in use.

The connector assembly may include an overvoltage protection device for protecting sensitive electronic components from damage due to a power surge. Such a device can be arranged to pass the surge to ground, for example through a component of the circuit board assembly such as the case. Suitable overvoltage protection devices are disclosed in U.S. patent application Ser. No. 014,118, filed Jan. 30, 1987, the disclosure of which is incorporated herein by reference.

BRIEF DESCRIPTION OF THE DRAWINGS

FIG. 1 is a cross-section through a connector assembly connected to a pair of circuit boards;

FIG. 2 is an isometric view of a circuit board assembly which incorporates the connector assembly shown in FIG. 1; and FIG. 3 is an isometric view of a connector module which forms a part of a connector assembly.

DESCRIPTION OF ILLUSTRATED EMBODIMENTS

FIG. 1 shows a connector assembly which comprises connector modules 31,32. Each module comprises contact elements having contact portions 33 which are connected to contacts 34 on circuit boards 24. The contact portions 33 extend beyond a first face 40 of the module. A first set of the contact elements have contact portions 36 for connection to an electrical device; as shown the contact portions 36 are pins for engaging corresponding sockets on the device. The contact portions 36 extend beyond a second face 41 of the module. A second set of the contact elements have contact portions 35 for engaging contact portions on the other module of the assembly so as to form electrical connections between respective contacts on the two circuit boards when the modules are mated. The contact portions 35 extend beyond a third face 42 of the module. The face 41 from which the contact portions 36 extend is sealed by means of sealing material 38. The interface between the mated modules is sealed by means of a gasket 37 of an elastomeric material. A sealing material such as a gel may be provided in the recesses in which the contact portions 36 are mounted, instead of the gasket 37.

FIG. 2 shows the modules 31,32 of the connector assembly connected to circuit boards 24. The boards are located in surface-to-surface thermal contact with a heat sink 26 which serves to dissipate heat generated by electronic components 25 on the boards. In addition to the connector assembly and the boards, the illustrated circuit board assembly includes a case which comprises covers 21,22 which can be sealed to one another and to the heat sink 26 by means of a latch (not shown) so as to seal the boards 24 environmentally. The covers 21,22 are provided with an internal layer of a gel material 23 for sealing the components 25 on the boards and to provide another path for heat transfer from the components. The gel may be provided as a single layer or in multiple layers. The gel may be molded or otherwise be provided with depressions 28 (as shown in FIG. 2) to allow it to conform to the components 25 on the boards 24.

The connector modules 31,32 comprise an overvoltage protection device 39 (shown schematically in FIG. 2), by means of which a power surge entering the assembly through contact portions 36 can be diverted to ground through the device 39 and the covers 21,22 thereby protecting the components 25 on the boards 24.

FIG. 3 shows a connector module 31 in which the configuration of the contact elements, as to which contact elements form the first set and to which form the second set, can be arranged by forming connections between the contact portions 33 which are for connection to contacts on a circuit board, and contact pads 41 which are connected internally to contact portions 36 for connection to an electrical device, and to contact portions (not shown) for connection to corresponding contact portions on another module. The connections between the contact portions 33 and the contact pads 41 may be made by means of short lengths of wire which may be attached at each end by means of solder or by wire bonding. After the wires have been attached, the wires may be encapsulated, for example by means of a curable potting compound, or by means of a gel.

What is claimed is:

1. A connector assembly for forming electrical connections to at least two circuit boards disposed in a substantially parallel surface-to-surface relationship, comprising a plurality of mateable connector modules, each of which comprises a plurality of contact elements having contact portions for connection to respective contacts on one of the circuit boards, a first set of the contact elements having contact portions for connection to an electrical device so as to form connections between the device and the said contacts on one or both of the circuit boards, and a second set of the contact elements having contact portions for connection to respective contact portions of the second set of contact elements of the other module so as to form connections between respective contacts on the two circuit boards when the modules are mated, in which assembly:
   (a) the contact portions for connection to the circuit board contacts are provide on a first face of each module;
   (b) the contact portions for connection to the electrical device are provided on a second face of each module that is opposite and substantially parallel to the first face; and
   (c) the contact portions for connection to the contact elements on the other module are provided on a third face of each module that is substantially perpendicular to the first and second faces.

2. A connector assembly as claimed in claim 1, which includes means for sealing of the modules against ingress of contaminants into contact with the contact portions when the modules are mated.

3. A connector assembly as claimed in claim 1, in which the contact portions provided on the third surface are resiliently deformable so that when the modules are mated, the said contact portions are urged into contact with one another.

4. A circuit board assembly which comprises at least two circuit boards that are electrically connected to one another by means of a connector assembly for forming electrical connections to the said at least two circuit boards disposed in a substantially parallel surface-to-surface relationship, comprising a plurality of mateable connector modules, each of which comprises a plurality of contact elements having contact portions for connection to respective contacts on one of the circuit boards, a first set of the contact elements having contact portions for connection to an electrical device so as to form connections between the device and the said contacts on one or both of the circuit boards, and a second set of the contact elements having contact portions for connection to respective contact portions of the second set of contact elements of the other module so as to form connections between respective contacts on the two circuit boards when the modules are mated, in which assembly:
   (a) the contact portions for connection to the circuit board contacts are provide on a first face of each module;
   (b) the contact portions for connection to the electrical device are provided on a second face of each module that is opposite and substantially parallel to the first face; and
   (c) the contact portions for connection to the contact elements on the other module are provided on a third face of each module that is substantially perpendicular to the first and second faces.

5. A circuit board assembly as claimed in claim 4, which includes a heat sink element located between the circuit boards with which the boards are in thermal contact.

6. A circuit board assembly as claimed in claim 4, which includes a case for enclosing the circuit boards.

7. A circuit board assembly as claimed in claim 6, which includes gel material within the case in thermal contact with at least one of the circuit boards.

* * * * *